United States Patent
Jau et al.

(10) Patent No.: US 10,381,761 B2
(45) Date of Patent: Aug. 13, 2019

(54) ADD-ON PROCESSING UNIT WITH I/O CONNECTORS

(71) Applicant: QUANTA COMPUTER INC., Taoyuan (TW)

(72) Inventors: Maw-Zan Jau, Taoyuan (TW); Jen-Mao Chen, Taoyuan (TW); Chun Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/886,409

(22) Filed: Feb. 1, 2018

(65) Prior Publication Data

US 2019/0027850 A1   Jan. 24, 2019

Related U.S. Application Data

(60) Provisional application No. 62/535,488, filed on Jul. 21, 2017.

(51) Int. Cl.
*H05K 7/02* (2006.01)
*H05K 7/04* (2006.01)
(Continued)

(52) U.S. Cl.
CPC ........... *H01R 12/721* (2013.01); *G06F 1/186* (2013.01); *G06F 1/20* (2013.01); *G06F 13/409* (2013.01);
(Continued)

(58) Field of Classification Search
CPC ........................ H01R 12/721; H01R 12/675; H01R 12/7082; H01R 2201/06
(Continued)

(56) References Cited

U.S. PATENT DOCUMENTS

| 6,058,025 A * | 5/2000 | Ecker | G06F 1/184 361/753 |
| 6,256,208 B1 * | 7/2001 | Supinski | G06F 1/184 361/759 |

(Continued)

FOREIGN PATENT DOCUMENTS

| CN | 104460839 A | 3/2015 |
| TW | 200951684 A | 12/2009 |

(Continued)

OTHER PUBLICATIONS

TW Office Action for Application No. 107111676, dated Dec. 22, 2018, w/ First Office Action Summary.
(Continued)

*Primary Examiner* — Hung S. Bui
(74) *Attorney, Agent, or Firm* — Nixon Peabody LLP; Zhou Lu

(57) ABSTRACT

A circuit card assembly includes a circuit card having front and back ends, substantially parallel longitudinal edges between the front and back ends, and a bus connector extending from one of the longitudinal edges. The circuit card assembly includes a bracket structure providing a mounting surface, the mounting surface comprising a bracket for engaging with a plurality of adjacent ones of a plurality of bracket slots with openings at a fixed pitch. The circuit card assembly includes a connector assembly at the surface of said circuit card at the first end, with at least a first input/output (I/O) connector, and a second I/O connector in a stacked arrangement with respect to the surface of said circuit card, where the first I/O connector and the second I/O connector extend through the bracket and are separated by the fixed pitch.

14 Claims, 8 Drawing Sheets

(51) Int. Cl.
   *H01R 12/72*   (2011.01)
   *H01R 12/67*   (2011.01)
   *H01R 12/70*   (2011.01)
   *G06F 13/40*   (2006.01)
   *G06F 1/18*    (2006.01)
   *G06F 1/20*    (2006.01)
   *H05K 7/14*    (2006.01)

(52) U.S. Cl.
   CPC ....... *H01R 12/675* (2013.01); *H01R 12/7082* (2013.01); *H05K 7/1487* (2013.01); *H01R 2201/06* (2013.01)

(58) Field of Classification Search
   USPC ................. 361/810, 807, 809, 727, 737
   See application file for complete search history.

(56) References Cited

U.S. PATENT DOCUMENTS

| | | | |
|---|---|---|---|
| 7,414,854 B1 * | 8/2008 | Douglas | G06F 1/30 |
| | | | 361/752 |
| 7,561,439 B2 * | 7/2009 | Orr | G06F 1/185 |
| | | | 361/724 |
| 7,672,141 B2 * | 3/2010 | Middleton | G06F 1/183 |
| | | | 361/785 |
| 9,298,227 B2 * | 3/2016 | Lee | G06F 1/185 |
| 2004/0145879 A1 | 7/2004 | Hensley et al. | |
| 2006/0044774 A1 | 3/2006 | Vasavda et al. | |
| 2017/0005446 A1 | 1/2017 | Regnier | |

FOREIGN PATENT DOCUMENTS

TW   M428648 U   5/2012
TW   M496150 U   2/2015

OTHER PUBLICATIONS

TW Search Report for Application No. 107111676, dated Dec. 22, 2018, w/ First Office Action.

Extended European Search Report for EP Application No. 18175327.8, dated Dec. 14, 2018.

* cited by examiner

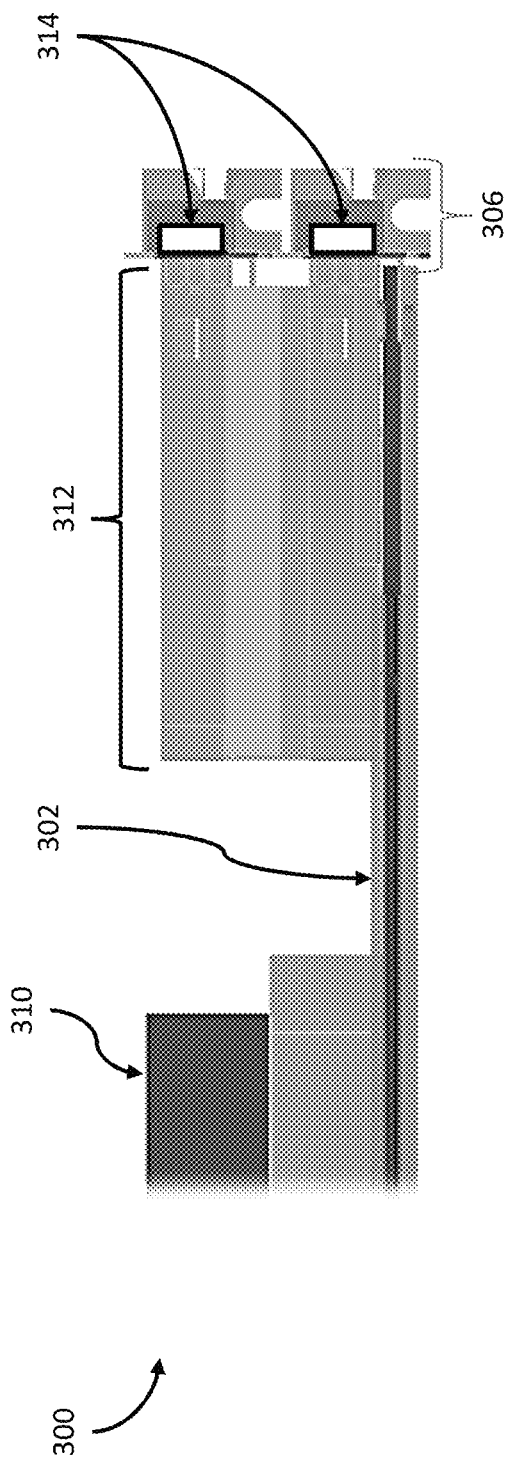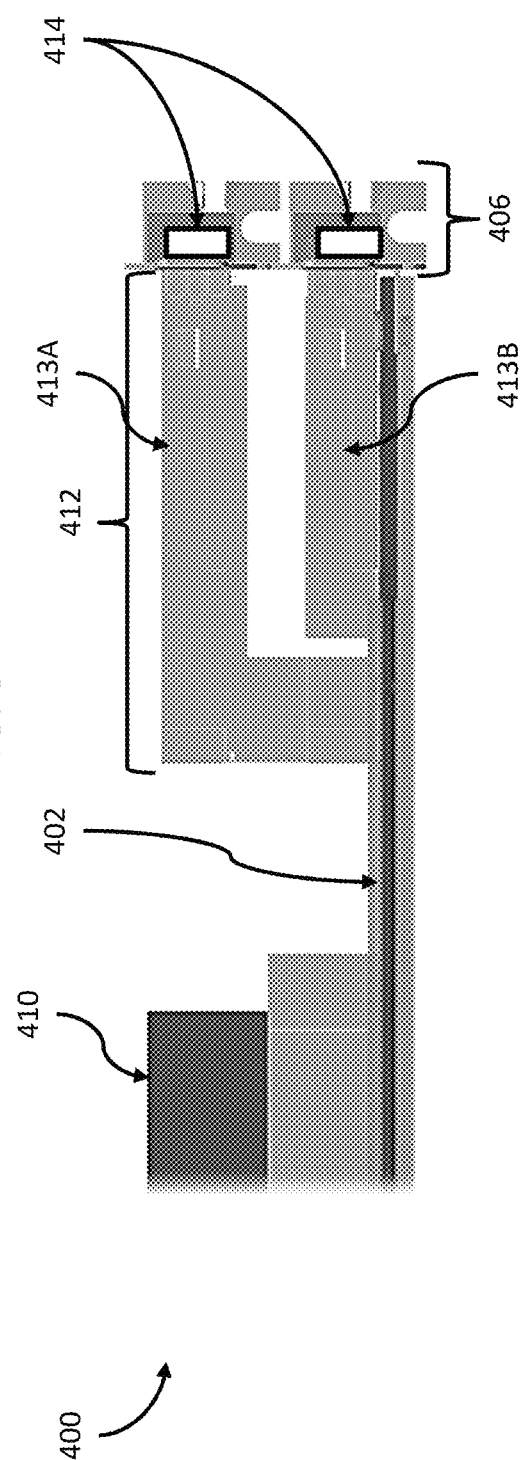

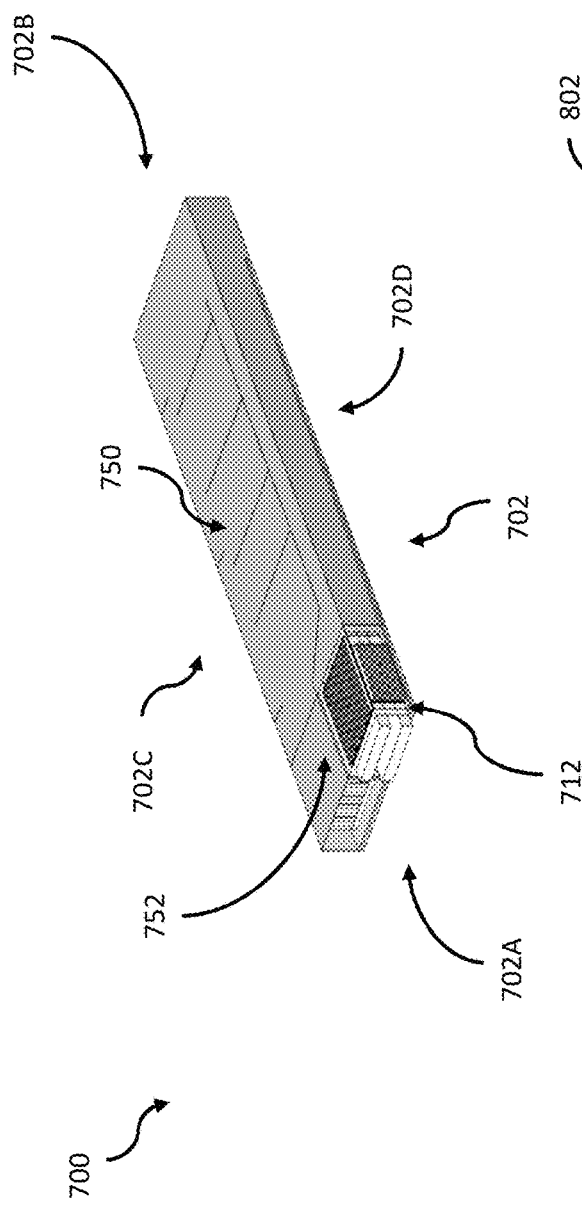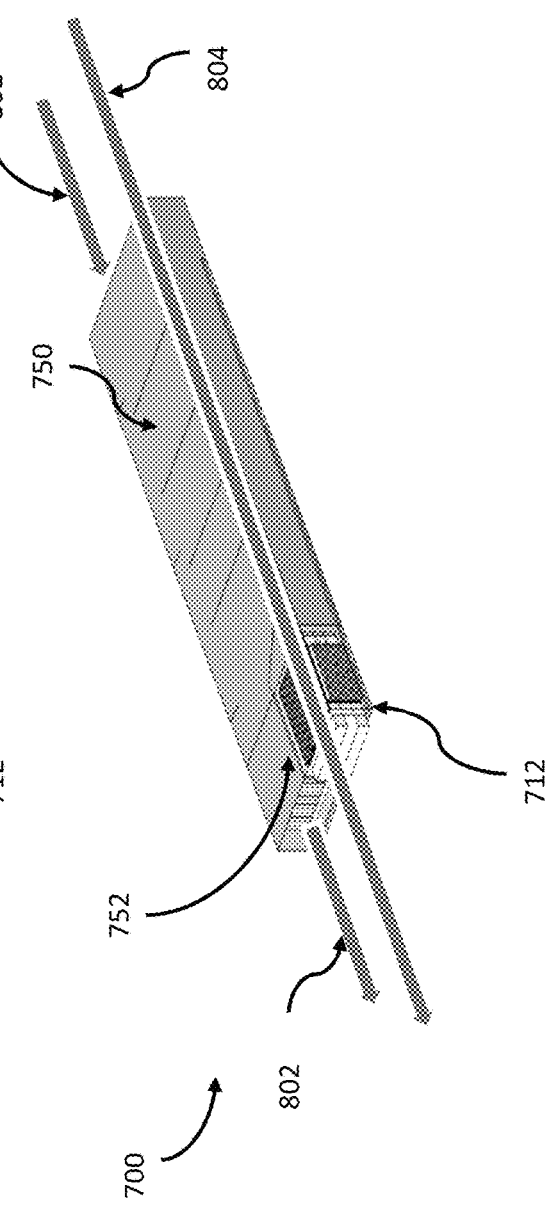

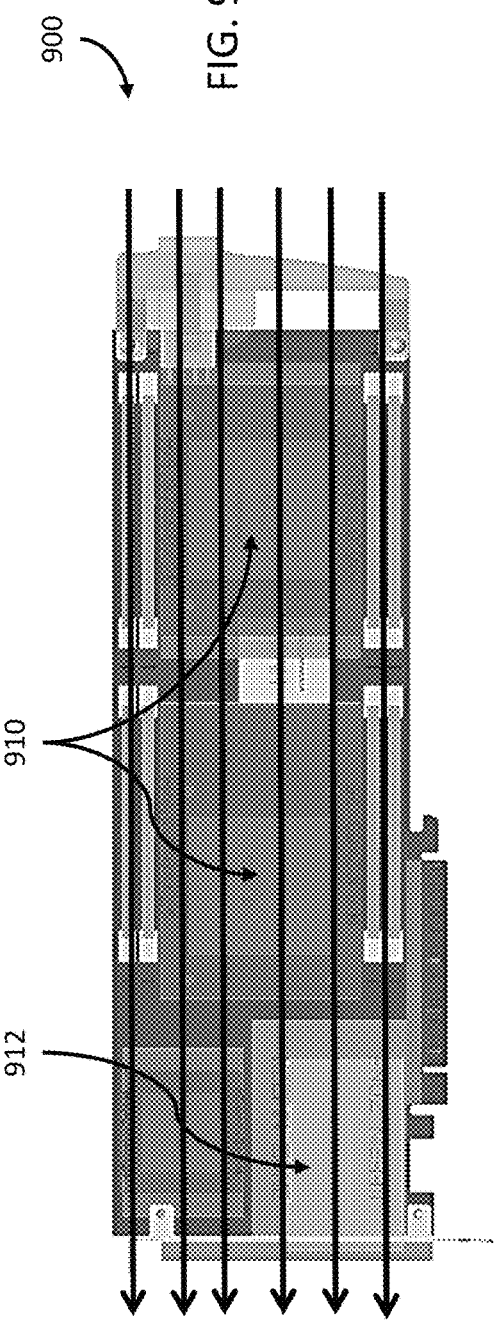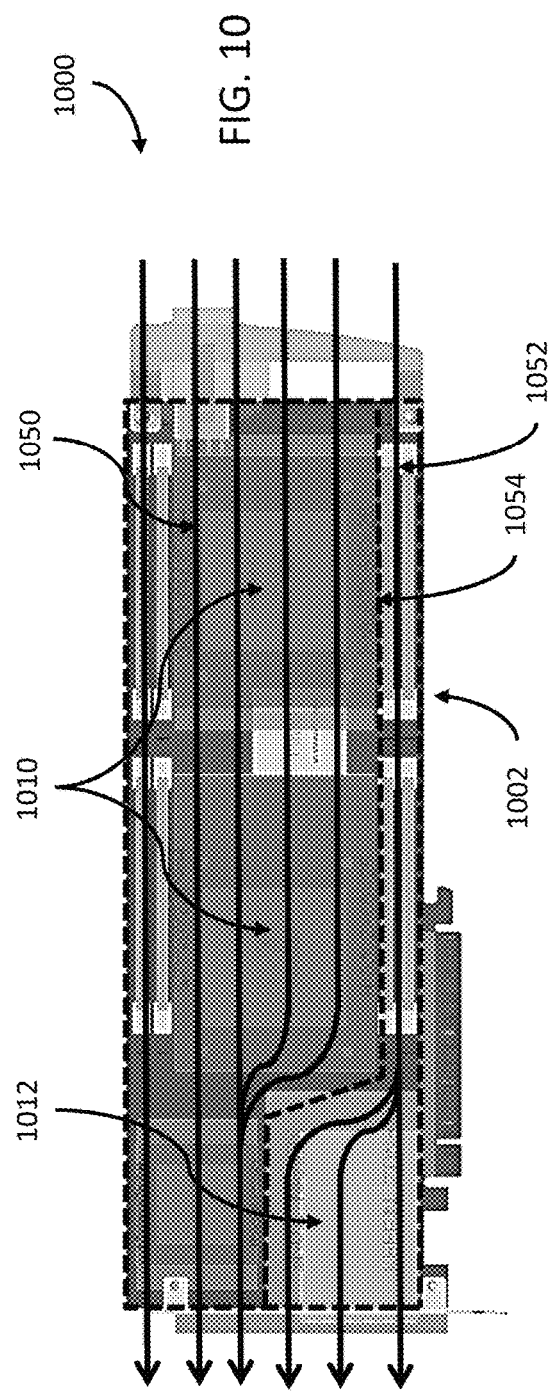

ADD-ON PROCESSING UNIT WITH I/O CONNECTORS

CROSS-REFERENCE TO RELATED APPLICATIONS

This application claims priority to and the benefit of U.S. Provisional Patent Application No. 62/535,488, entitled "Gap Design of Connector Group" and filed Jul. 21, 2017, the contents of which are hereby incorporated by reference in their entirety.

FIELD OF THE INVENTION

The present invention relates to add-on processing units, and more specifically to apparatus and methods for assembling add-on units with input/output connectors.

BACKGROUND

In recent years, add-on processing units, such as general-purpose computing on graphics processing units (GPGPU or $GP^2U$), have become popular. In a GPGPU unit, a graphics processing unit (GPU), which typically handles computation only for computer graphics, is configured to perform computation in applications traditionally handled by the central processing unit (CPU). In operation, a GPGPU unit analyzes data from the CPU as if it were in image or other graphic form. Further, although GPUs operate at lower frequencies than CPUs, they typically have many times the number of cores. Thus, GPUs can operate on pictures and graphical data at far faster rates than traditional CPUs. Consequently, migrating data into graphical form, and then using the GPU to scan and analyze it, can result in significant improvements in computation time.

More recently, GPGPU units have been investigated for improve throughput in communications applications. For example, a GPGPU unit can be configured to perform communications and signal processing functions at a much higher throughput or data rate that a traditional CPU. Thus, a GPGPU unit can significantly improve throughput in many types of transceiver systems.

However, while a GPGPU unit may offer computational advantages, implementing a communications GPGPU unit is far from trivial. For one, traditional GPGPU unit design does not typically include input/output (I/O) ports that would be necessary for a communications-based GPGPU unit to operate efficiently. Second, the high performance of GPGPU unit comes at a high thermal cost, resulting in most GPGPU units running at relatively high temperatures (typically 80° C.-85° C. As a result, these high temperatures do not provide an adequate environment for communication of certain types of signals (e.g., optical signals). Finally, GPGPU unit designs incorporating I/O ports typically require specialized connection and mounting schemes, thereby providing limited backward compatibility with older chassis support traditional form factor designs for add-on cards.

Therefore, there is a need for add-on processing unit designs, including I/O connectors that consider thermal issues and backward compatibility issues.

SUMMARY

Embodiments concern a circuit card assembly defining an add-on processing unit with I/O connectors. A circuit card assembly according to a first embodiment is configured for removable attachment to a computer system having a plurality of bracket slots arranged with a fixed pitch. The circuit card assembly includes a circuit card having a front end, a back end, and substantially parallel longitudinal edges between the front end and the back end. The circuit card includes at least one bus connector extending from one of the longitudinal edges. The circuit card assembly also includes a bracket structure that provides a mounting surface at a first end of said circuit card. The mounting surface extends perpendicularly to a first surface of said circuit card and extends perpendicularly to said parallel longitudinal edges. The mounting surface comprises a bracket for engaging with a plurality of adjacent ones of the plurality of bracket slots. The circuit card assembly also includes a connector assembly disposed on the surface of said circuit card at said first end.

The connector assembly includes a first input/output (I/O) connector and a second I/O connector in a stacked arrangement with respect to the surface of said circuit card. A width of the connector assembly is less than a width of the circuit card between the longitudinal edges. The first I/O connector is positioned between the second I/O connector and the circuit card. Further, the first I/O connector and the second I/O connector extend through the bracket and are separated by the fixed pitch.

In some implementations, the connector assembly comprises a unitary body mechanically coupling the first I/O connector and the second I/O connector. Further, the connector assembly can further include one or more heat sink structures disposed on the outer surface of the unitary body. The unitary body can also include one or more spaces between the first I/O connector and the second I/O connector. The connector assembly can include one or more additional heat sink structures disposed in at least one of the spaces. The additional heat sink structures can be a plurality of fins extending parallel to the parallel longitudinal edges.

In some implementations, the connector assembly includes a first connector structure extending from the surface of the first circuit card that contains the first I/O connector. The connector assembly also includes a second connector structure, extending from the surface of the first circuit card independently from the first connector structure, and containing the second I/O connector. The second connector structure can include a circuit sub-board, having the second I/O connector disposed thereon, and a board connector structure coupling the circuit sub-board to the circuit card.

In some implementations, the circuit card assembly can include a U-shaped cover disposed over the surface of the circuit card. The U-shaped cover can have a cut-out for a portion of the surface of the circuit card having the connector assembly disposed thereon.

In some implementations, the circuit card assembly can also include a plurality of heat generating components disposed on the surface of the circuit card. These heat generating components can be one or more graphics processing units.

In some implementations, the U-shaped cover has a first open end coincident with the first end of the circuit card and a second open end coincident with the second end of the circuit card. The U-shaped cover can also include and a wall extending from an inner surface the U-shaped cover towards the surface of the circuit card. The wall can define at least a first zone and a second zone in the circuit card assembly. The first zone defines a path from the first open end to the second open end and includes the connector assembly, but excludes the plurality of heat generating components. The second zone defines a path from the first open end to the second open end and includes the plurality of heat generating components, but excludes the connector assembly.

In some implementations, the bus connector is a Peripheral Component Interconnect Express (PCIe) connector. Further, each of the first I/O connector and the second I/O connector can be Quad Small Form-factor Pluggable (QSFP) connectors. Additionally, the plurality of bracket slots can be ISA bracket slots.

In some implementations, the connector assembly can further include a third I/O connector and a fourth I/O connector, in a stacked arrangement with respect to the surface of the circuit card.

BRIEF DESCRIPTION OF THE DRAWINGS

FIG. 3 shows a cross-section view of a portion of circuit card assembly configured in accordance with an embodiment.

FIG. 4 shows a cross-section view of a portion of circuit card assembly configured in accordance with an embodiment.

FIG. 7 shows an isometric view of a circuit card assembly configured in accordance with an embodiment.

FIG. 8 shows airflow with respect to the circuit card assembly of FIG. 7.

FIG. 9 shows airflow over a circuit card assembly under a cover that is useful for describing the various embodiments.

FIG. 10 shows airflow over a circuit card assembly under a cover and including diverting features in accordance with an embodiment.

DETAILED DESCRIPTION

Figure 1:
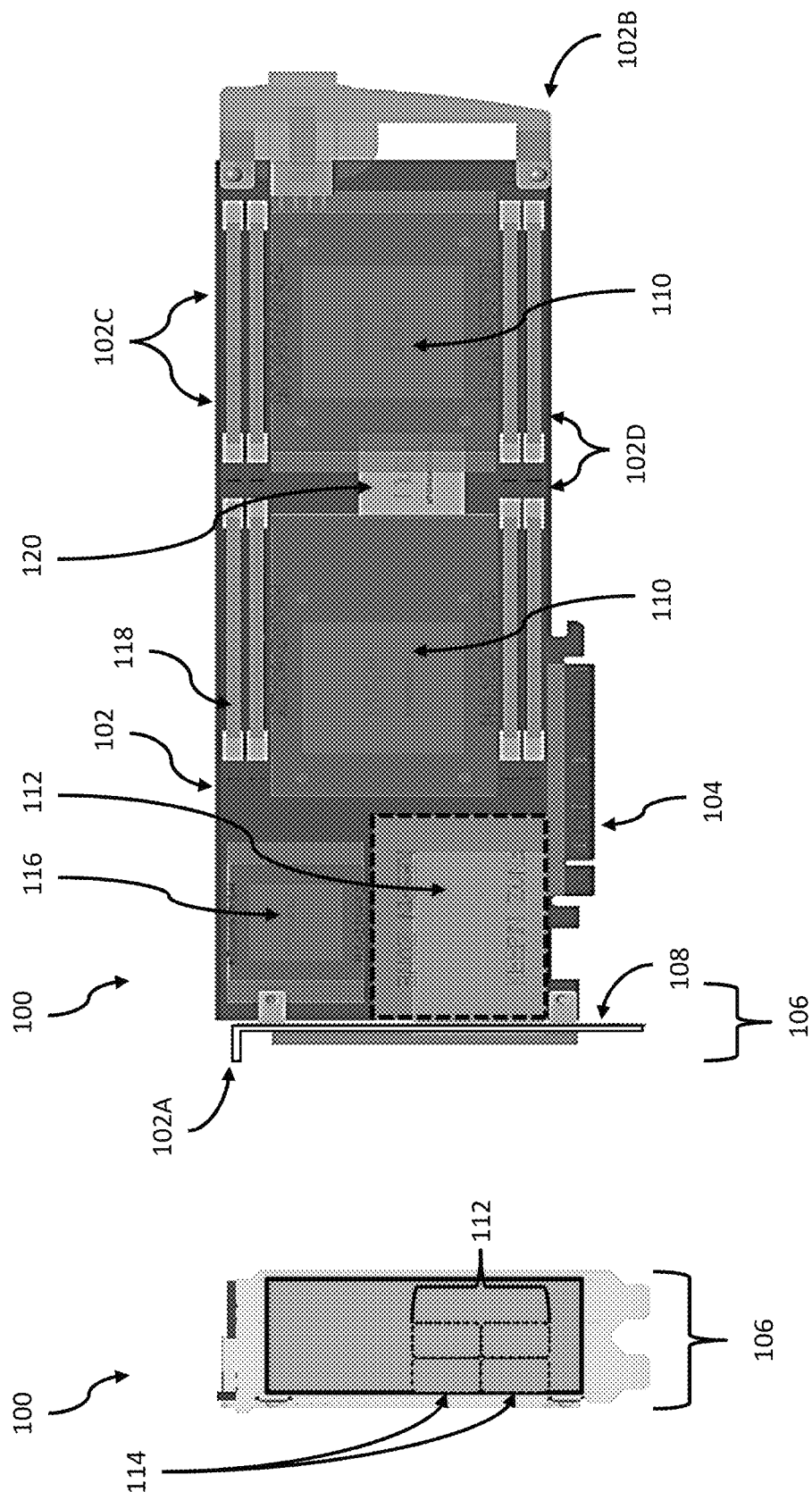
FIG. 1A is a front side view of a conventional circuit card assembly that is useful for describing the various embodiments.
FIG. 1B is a side view of the circuit card assembly of FIG. 1A.

The present invention is described with reference to the attached figures, wherein like reference numerals are used throughout the figures to designate similar or equivalent elements. The figures are not drawn to scale, and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As discussed above, inclusion of I/O ports in an add-on processing unit, such as a GPGPU unit, is not a trivial modification. As further noted above, there concerns regarding backward compatibility and operating temperatures. These are discussed in more detail below with respect to FIGS. 1A and 1B.

Although the various embodiments will be discussed primarily with respect to a GPGPU unit, this is solely for ease of illustration. The methods discussed herein can be applied to any other type of add-on processing unit. For example, an FPGA HPC card or an Ethernet switch card A conventional design for adding I/O ports to a circuit card assembly 100 of an add-on processing unit, specifically a GPGPU unit, is illustrated in FIGS. 1A and 1B. FIG. 1A is a front side view of a circuit card assembly 100 defining the GPGPU unit. FIG. 1B is a side view of the circuit card assembly 100.

As shown in FIGS. 1A and 1B, a conventional design for a circuit card assembly 100 includes a substantially planar circuit card 102 with a front end 102A, a back end 102B, a first longitudinal edge 102C and a second longitudinal edge 102D. In the circuit card assembly 100, the longitudinal edges 102C and 102D are substantially parallel to each other. The circuit card 102 can also include at least one bus connector 104 extending from one of longitudinal edges 102C and 102D. In the exemplary configuration of FIGS. 1A and 1B, a bus connector 104 extends from longitudinal edge 102D and substantially parallel to the plane of circuit card 102. The bus connector 104 in FIGS. 1A and 1B is illustrated as a Peripheral Component Interconnect Express (PCIe) bus, but the various embodiments are not limited in this regard. Rather, any other computer bus type can be used in the various embodiments without limitation.

The circuit card 102 can be, for example, a printed circuit board (PCB) manufactured according to any known processes. However, the various embodiments are not limited in this regard. Rather, any other technologies for forming a substrate or other substantially planar structure for mechanically supporting and electrically connecting various electronic components can be used in place of a PCB.

The circuit card assembly 100 can also include a bracket structure 106 attached to the circuit card 102. The bracket structure 106 can include a bracket 108 configured for attachment to one or more bracket slots of a computer system to provide proper mechanical and electrical connection. The interplay between circuit cards and bracket slots is illustrated in FIG. 11.

Figure 11:
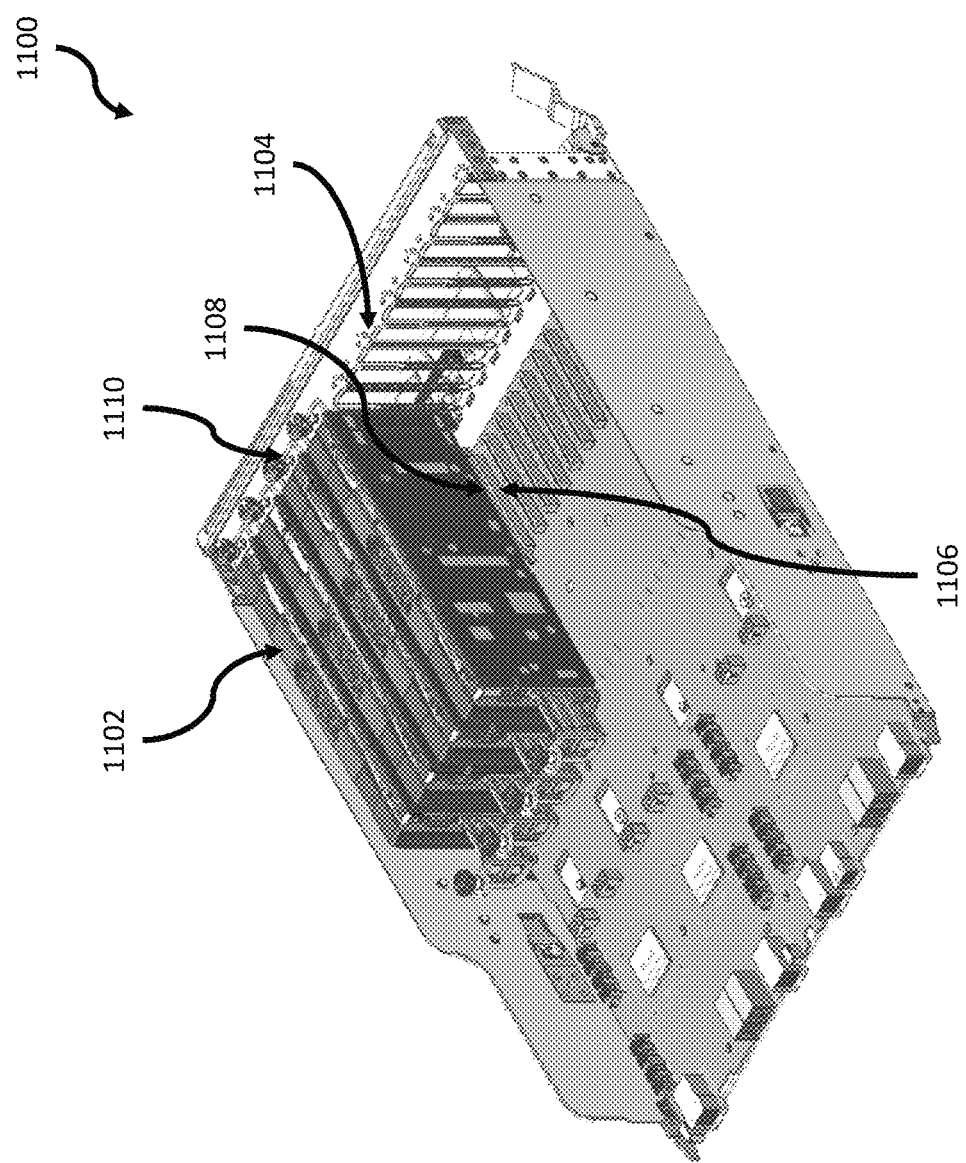
FIG. 11 shows an exemplary computer system that is useful for describing the various embodiments.

An exemplary computer system is illustrated in FIG. 11. As shown in FIG. 11, a computer system 1100 can include multiple bracket slots 1104 and bus connectors 1106. An add-on unit 1102, with a bus connector 1108 and a bracket 1110, is installed in the computer system 1100 by inserting the add-on unit 1102 into the computer system so that a bus connector 1108 engages with a corresponding bus connector 1106 of the computer system 1100. The bus connector 1106 may be on a motherboard or daughterboard of the computer system 1100. The bus connectors 1106 and 1108, the bracket 1110, and the bracket slots 1104 are all arranged so that proper insertion of the add-on unit 1102 into computer system 1100 results in: (1) the bus connectors 1106 and 1108 being aligned and connecting properly to each other; and (2) the bracket 1110 being aligned and engaging properly with the bracket slot 1104.

Referring back to FIGS. 1A and 1B, the circuit card assembly 100 is configured to support I/O and GPGPU features by incorporating certain components. For example, as shown in FIG. 1, the circuit card 102 is configured to support two or more GPUs 110 and a connector assembly 112. The connector assembly 112 can include a number of I/O connectors 114. In addition, the circuit card assembly 100 can include additional components, such as switch elements 116, memory elements 118, and other controller elements 120. For example, controller elements 120 can include a management controller or other controller types for managing various operations of the other components of the circuit card 102. However, a GPGPU unit is not limited to the components listed above, and may include more or less components than shown in FIGS. 1A and 1B.

Although the circuit card assembly 100 would provide a functional GPGPU-based I/O unit, there are various problems with the configuration shown in FIGS. 1A and 1B.

First, conventional connector assemblies are typically incompatible with conventional bracket slot arrangements in conventional computer systems. For example, many computer systems typically utilize an Industry Standard Architecture (ISA) slot configuration for mechanically coupling add-on units to a computer system, even to support PCIe components. In this type of configuration, the bracket slots in the computer system consist of a series of openings at a fixed pitch. As such, if the arrangement of I/O connectors associated with the circuit card assembly is wider than the width of the slots, insertion is impossible.

This is the case with circuit card assembly 100. As shown in FIG. 1A, circuit card assembly 100 is configured to have a bracket assembly 106 that is the width of two ISA bracket slots. However, the I/O connectors 114 do not line up with the ISA bracket slot arrangement. As a result, if the ISA bracket slots of the computer system consist of a series of openings as opposed to a completely open space, the circuit card assembly 100 would be incompatible with such a computer system.

Second, even if the arrangement of the I/O connectors 114 could be configured to be compatible with a traditional ISA bracket slot arrangement, there are still concerns with such an arrangement. In particular, the introduction of I/O connectors can potentially introduce an additional heat source. At the very least, the additional I/O connectors can ventilation through the add-on processing unit. In either case, this can lead to elevated temperatures in the add-on unit. Further, some types of I/O components may be incompatible with the resulting high temperature environment. For example, optical I/O components, such as optical transceivers, tend to be more sensitive to temperature changes than other components. As a result, the performance of some types of I/O components may be adversely affected when incorporated into the add-on processing unit.

In view of the foregoing issues, the various embodiments are directed to new architectures for add-on processing units, such as GPGPU-based I/O units, that provide compatibility with computer systems having bracket slots with single or multiple openings and that address thermal issues associated with such add-on processing units.

Figure 2:
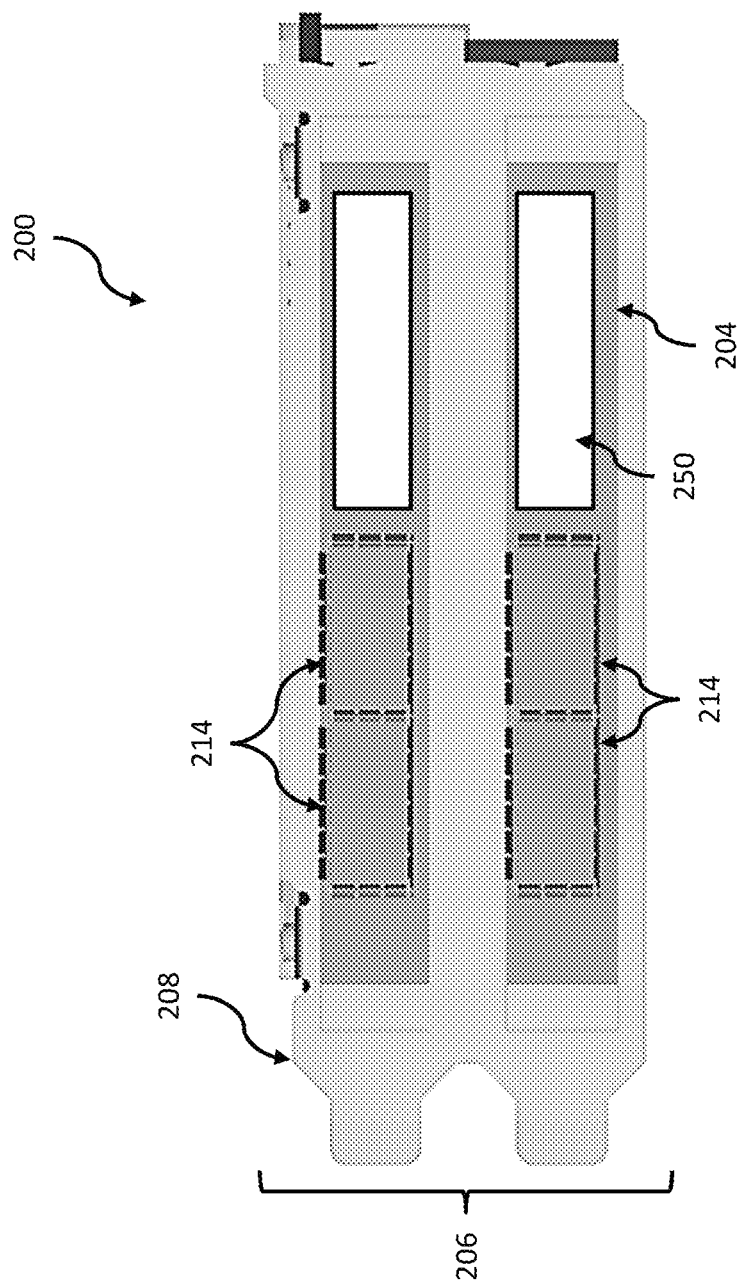
FIG. 2 shows a front view of a circuit card assembly configured in accordance with an embodiment.

First, as to providing compatibility, an add-on processing unit can be configured as shown in FIG. 2. FIG. 2 shows a front view of a circuit card assembly 200 configured in accordance with an embodiment. The circuit card assembly 200 can be configured in a similar fashion as circuit card assembly 100 in FIGS. 1A and 1B. However, as shown in FIG. 2, the circuit card assembly 200 can be configured so that any I/O connectors 214 extending through the bracket 208 of bracket structure 206 are aligned with bracket opening areas 204. The bracket opening areas 204 are designed according the desired bracket slot design, such as an ISA bracket slot design. In this manner, when circuit card assembly is inserted into a computer system, the I/O connectors 214 will align with the openings in the bracket slots of the computer system.

The exemplary configuration shown in FIG. 2 shows an arrangement of four connectors, but the various embodiments are not limited in this regard. That is, any number of connectors can be provided. However, in the various embodiments, the number of connectors should be limited so as not to extend across the entire length of a corresponding bracket structure. This configuration is needed so that ventilation openings 250 can be provided in a portion of the of the bracket structure 206, at least along bracket opening areas 204.

The configuration shown in FIG. 2 can be accomplished in a variety of ways. In particular, by providing a new connector assembly configuration. Exemplary configurations for connector assemblies in accordance with the various embodiments are illustrated in FIGS. 3, 4, 5A, and 5B.

FIG. 3 shows a cross-section view of a circuit card assembly 300 configured in accordance with an embodiment. In particular, FIG. 3 shows a cross-section view of the portion of the circuit card assembly 300 near a front end 302A of the circuit card 302. As shown in FIG. 3, the circuit card assembly 300 can include components similar to the circuit card assembly 100 in FIGS. 1A and 1B. For example, the circuit card assembly 300 can include a circuit card 302, a bracket structure 306 (including ventilation openings which are not shown for ease of illustration), GPU's 310, and a connector assembly 312 with a stacked arrangement of I/O connectors 314. The operation of components 302, 306, 310, 312, and 314 is substantially similar to that of components 102, 106, 110, 112, and 114 in FIGS. 1A and 1B. Thus, the description for components 102, 106, 110, 112, and 114 is sufficient for describing components 302, 306, 310, 312, and 314. Moreover, circuit card assembly 300 can also include other components of the circuit card assembly 100, even if not explicitly described herein.

However, unlike the circuit card assembly 100 in FIGS. 1A and 1B, the circuit card assembly 300 in FIG. 3 is configured to provide an arrangement of I/O connectors 314 corresponding to that illustrated in FIG. 2. That is, the I/O connectors 314 extending through the bracket structure 306 are arranged so as to be aligned with bracket opening areas. As noted above with respect to FIG. 2, this configuration is provided in FIG. 3 so that the I/O connectors 314 will align with the openings in the bracket slots of the computer system.

The configuration of FIG. 3 is accomplished by configuring the proper arrangement of I/O connectors 314 in a connector assembly 312 that is a unitary body. That is, a single component is mounted on circuit card 302 and houses supporting hardware and electronics for I/O connectors 314.

However, the various embodiments are not limited to unitary body configurations. Rather, connectors can be supporting while using multiple bodies mounted with a circuit card assembly. One exemplary configuration is shown in FIG. 4. In FIG. 4, there is shown a cross-section view of a circuit card assembly 400 configured in accordance with an embodiment, in particular, a cross-section view of the portion of the circuit card assembly 400 near a front end 402A of the circuit card 402. As shown in FIG. 4, the circuit card assembly 400 can include components similar to the circuit card assembly 100 in FIG. 1. For example, the circuit card assembly 400 can include a circuit card 402, a bracket structure 406 (including ventilation openings which are not shown for ease of illustration), GPU's 410, and a connector assembly 412 with I/O connectors 414. The operation of components 402, 406, 410, 412, and 414 is substantially similar to that of components 102, 106, 110, 112, and 114 in FIGS. 1A and 1B. Thus, the description components 102, 106, 110, 112, and 114 is sufficient for describing components 402, 406, 410, 412, and 414. Moreover, circuit card assembly 400 can also include other components of the circuit card assembly 100, even if not explicitly described herein.

However, unlike the circuit card assembly 100 in FIGS. 1A and 1B, the circuit card assembly 400 in FIG. 4 is also configured to provide an arrangement of connectors 414 corresponding to that illustrated in FIG. 2. That is, the I/O connectors 414 extending through bracket structure 406 are arranged so as to be aligned with bracket opening areas. As noted above with respect to FIG. 2, this configuration is provided in FIG. 4 so that the I/O connectors 314 will align with the openings in the bracket slots of the computer system.

In the configuration of FIG. 4, this is accomplished by configuring the connector assembly 412 as two or more bodies, each separately coupled to the circuit card 402. For example, as shown in FIG. 4, a first body 413A is disposed directly on the circuit card 402. A second body 413B is attached to the circuit card 402, but is configured to extend over the first body 413A without contacting the first body 413A.

The second body 413B can be mechanically supported via its connection to the circuit card 402 and the contact between a corresponding connector 414 and the bracket structure 406. However, in some configurations, additional support structures can be provided to mechanically support the second body 413B.

Figure 5A:
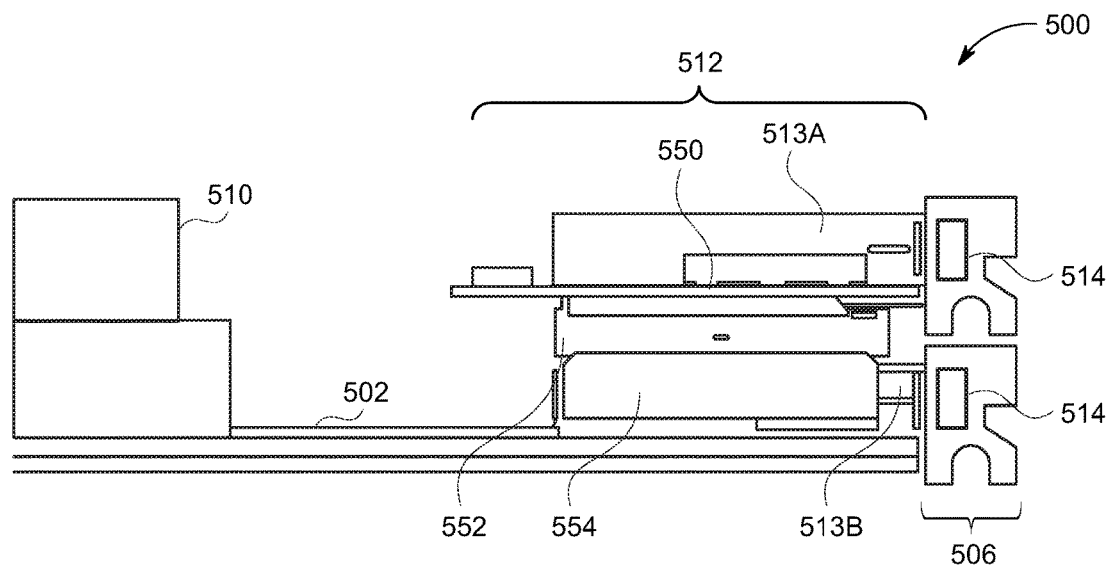
FIG. 5A shows a cross-section view of a portion of circuit card assembly configured in accordance with an embodiment.
Figure 5B:
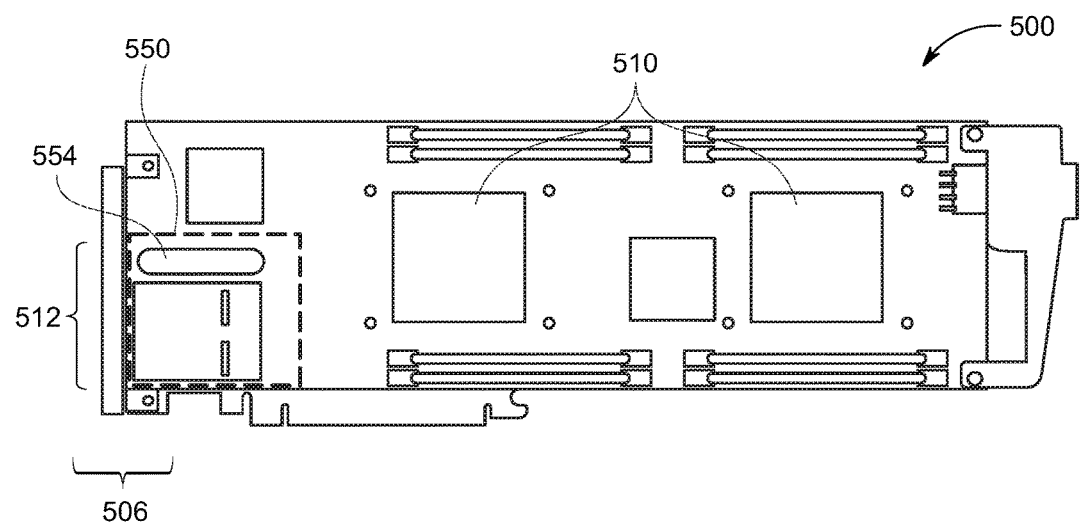
FIG. 5B shows a side view of the circuit card assembly of FIG. 5A.

Another alternative to a unitary body configuration is shown in FIGS. 5A and 5B. In FIG. 5A, there is shown a cross-section view of a circuit card assembly 500 configured in accordance with an embodiment. In particular, FIG. 5A shows a cross-section view of the portion of the circuit card assembly 500 near a front end 502A of the circuit card 502. FIG. 5B shows a side view of the circuit card assembly 500. As shown in FIGS. 5A and 5B, the circuit card assembly 500 can include components similar to the circuit card assembly 100 in FIG. 1. For example, the circuit card assembly 500 can include a circuit card 502, a bracket structure 506 (including ventilation openings which are not shown for ease of illustration), GPU's 510, and a connector assembly 512 with I/O connectors 514. The operation of components 502, 506, 510, 512, and 514 is substantially similar to that of components 102, 106, 110, 112, and 114 in FIGS. 1A and 1B. Thus, the description for components 102, 106, 110, 112, and 114 is sufficient for describing components 502, 506, 510, 512, and 514. Moreover, circuit card assembly 500 can also include other components of the circuit card assembly 100, even if not explicitly described herein.

However, unlike the circuit card assembly 100 in FIGS. 1A and 1B, the circuit card assembly 500 in FIGS. 5A and 5B is configured to provide an arrangement of connectors 514 corresponding to that illustrated in FIG. 2. That is, the I/O connectors 514 extending through bracket structure 506 are aligned with bracket opening areas. As noted above with respect to FIG. 2, this configuration is provided in FIG. 5 so that the I/O connectors 314 will align with the openings in the bracket slots of the computer system.

In the configuration of FIGS. 5A and 5B, this is accomplished by configuring the connector assembly 512 as two or more bodies, but using additional circuit cards. For example, as shown in FIGS. 5A and 5B, a first body 513A is disposed directly on the circuit card 502. A second body 513B is disposed directly on a daughterboard 550, which is shown in FIG. 5A as being attached to the circuit card 502 via a complementary pair of connectors 552 and 554.

The daughterboard 550 is configured to extend over body 513A without contacting body 513A. The daughterboard 550 can be mechanically supported via the connectors 552 and 554 and the contact between a corresponding connector 514 and the bracket structure 506. However, in some configurations, additional support structures can be provided to mechanically support the daughterboard 550.

Moreover, although the connectors provide both the mechanical and electrical connections in circuit card assembly 500, the various embodiments are not limited in this regard. Rather, the mechanical and electrical connections can be separate. For example, mechanical support structure can be provided to position the daughterboard 550 in circuit card assembly 500. Separately, cable, connectors, and the like can be used to couple the daughterboard 550 to the circuit card 502 while providing little or no mechanical support.

As noted above, the various embodiments can incorporate any number of I/O connectors. Furthermore, the I/O connectors can be provided in various combinations. For example, referring back to FIG. 3, the unitary body connector assembly 312 can provide 2, 3, 4, or any number of I/O connectors. In some cases, instead of a single unitary body connector assembly, two or more side-by-side unitary bodies can be disposed on the circuit card to define the connector assembly. In such a configuration, each unitary body can be a 2×1 (tall×wide) arrangement of connectors. A similar configuration can be utilized for the configurations shown in FIGS. 4, 5A, and 5B. That is, referring now to FIG. 4, each body 413A and 413B can be configured to provide 1, 2, or more connectors. For example, each body 413A and 413B can be a 1×2 arrangement of connectors. Similarly, referring to FIG. 5A, each body 513A and 513B can also be configured to provide 1, 2, or more connectors.

While FIGS. 3, 4, 5A, and 5B illustrate exemplary configurations for implementing an arrangement of I/O connector compatible with an arrangement of bracket slots at a fixed pitch, there are still thermal challenges that need to be addressed.

As noted above, the processing components of a typical add-on processing unit, such as a GPGPU unit, generate a substantial amount of heat. Further, for cooling purposes, some types of add-on processing units, such as a GPGPU unit, typically do not include a fan or other cooling device. For example, in the case of a GPGPU unit, such units are typically cooled by airflow generated by a fan in the computer system the GPGPU unit is installed in. Referring to FIG. 1, fans are typically configured to supply air at the back end 102B and exit out the front end 102A.

As expected, a first problem in such a configuration, including additional components in the airflow path, such as I/O connectors, tend to block airflow. This results in even higher temperatures in the GPGPU unit. A second problem may then be exacerbated—temperature sensitivity of the I/O connectors. For example, the performance of certain optical transceivers used in many applications, such as Quad Small Form-factor Pluggable (QSFP) transceivers, is susceptible to increased temperature. As such, the various embodiments are also directed to methods for providing improved cooling in an add-on processing unit incorporating these types of I/O connectors. Specifically, the various embodiments are directed to methods for improving cooling at least in the region of the connector assembly for the configurations discussed above.

Figure 6:
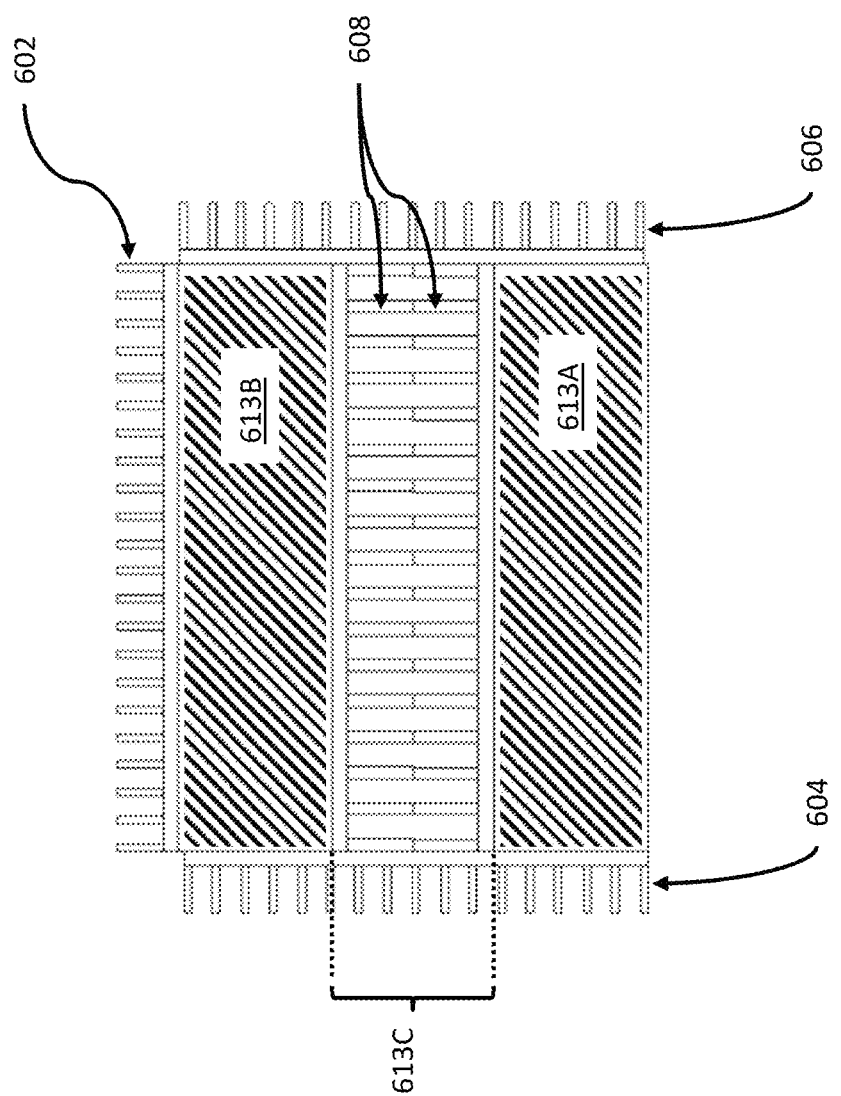
FIG. 6 illustrates a cross-section view of a connector assembly 600 in accordance with an embodiment.

A first cooling option is shown in FIG. 6. FIG. 6 illustrates a cross-section view of a connector assembly 600 in accordance with an embodiment. In the configuration of FIG. 6, the connector assembly 600 consists of a first body 613A, which would be disposed on a circuit card, and a second body 613B, which is disposed above the first body 613A, and a space 613C in between bodies 613A and 613B. Such bodies can be substantially similar to those illustrated in FIGS. 4 and 5A. Alternatively, the bodies 613A and 613B can be part of a unitary body, as shown in FIG. 3. That is, the unitary body of FIG. 3 can be configured to include a space between connector portions.

Regardless of the configuration, a first potential cooling method is to utilize a series of heat sinks. In particular, as shown in FIG. 6, a number of heat sinks 602, 604, 606 can be attached to the outer surfaces of the connector assembly 600. Additionally, as also shown in FIG. 6, heat sinks 608 can also be positioned in any spaces 613C defined in the connector assembly. Thus, even in the elevated temperature environment of a GPGPU unit, an efficient means for drawing heat from the connector assembly 600 is provided. Thus, conventional ventilation (via computer system fans) may be sufficient to keep the connector assembly 600 at an acceptable temperature.

Although FIG. 6 appears to show fin-type heat sinks, this is solely for purposes of illustration. In the various embodiments, any other type of heat sink can be used without limitation.

A second cooling option is shown in FIG. 7. FIG. 7 shows an isometric view of a circuit card assembly 700. The circuit card assembly 700 can be configured as described above with respect to any of FIGS. 2, 3, 4, 5A, or 5B. That is, the circuit card assembly 700 in FIG. 7 can include a connector assembly 712 disposed on a circuit card 702. Additionally, the circuit card assembly 700 can include any of the components described above with respect to any of FIGS. 2, 3, 4, 5A, or 5B. In the configuration illustrated in FIG. 7, the connector assembly is illustrated as including a heat sink arrangement, as discussed above with respect to FIG. 6. However, in other embodiments, the connector assembly 712 can be provided without the heat sink arrangement of FIG. 6.

As shown in FIG. 7, the circuit card assembly 700 includes a cover 750 extending over the circuit card 702 from a first end 702A of the circuit card 702 to a second end 702B of the circuit card 702. The cover 750 is positioned to cover the components disposed on the circuit card 702. Additionally, the cover 750 is configured to direct airflow through the circuit card assembly 700 from the back end 702B to the front end 702A. Thus, the cover 750 can be generally U-shaped so that the cover 750 extends from a first longitudinal edge 702C of the circuit card 702 to a second longitudinal edge 702D of the circuit card 702. Thus, the cover 750 surrounds any components disposed on circuit card 702 and channels air through these components.

However, a potential issue with a cover in an add-on unit, such as GPGPU unit, is that the cover may trap heated air and thus direct that heated air to more sensitive components, such as I/O connectors in the connector assembly. Accordingly, as shown in FIG. 7, the cover 750 is configured to provide extra ventilation for the connector assembly 712. In particular, the cover 750 is configured to include an opening or cutout 752 that exposes all or some of the connector assembly 712. In this way, the connector assembly 712 can be exposed to cooler air outside of the cover 750, i.e., outside of the circuit card assembly 700. In this manner, the cooling of the connector assembly is not dependent on solely the airflow though the cover 750. For example, as shown in FIG. 8.

FIG. 8 shows airflow with respect to circuit card assembly 700. As shown in FIG. 8, the cover 750 results in a first airflow 802 through the circuit card assembly 700 under cover 750. However, by adding the cutout 752, a second external (and cooler) airflow 804 is provided for the connector assembly 712.

In some cases, the size of the cutout can vary. For example, even with the cutout 752, some heated air may still reach the connector assembly 712. Accordingly, in some embodiments, the distance between the edges of the cutout 752 and the connector assembly 712 can be increased so that at least some heated air escapes prior to reaching the connector assembly 712. Moreover, in other cases, the edges of the cutout 752 can be configured to reduce the amount of heated air inside the cover 750 reaching the connector assembly 712. For example, the edges of the cutout 752 can be rolled, angled, or otherwise shaped to re-direct some or all of the airflow within the cover 750 away from the connector assembly.

A third cooling option is described with respect to FIGS. 9 and 10. FIG. 9 shows airflow (represented by arrows) over a circuit card assembly 900 under a cover, similar to the configuration described in FIGS. 7 and 8, but with no cutout. In such a configuration, substantial heating of the connector assembly 912 may occur. In particular, since the airflow cools the GPUs 910 first, air reaching the area containing the connector assembly 912 will be heated. Thus, the connector assembly 912 may not be appropriately cooled. This problem can be addressed by the configuration in FIG. 10.

FIG. 10 shows airflow (represented by arrows) over a circuit card assembly 1000 under a cover, but with diverting features in accordance with an embodiment. As shown in FIG. 10, the circuit card assembly 1000 can be divided into two airflow zones 1050 and 1052. A first zone 1050 can be established so that a connector assembly 1012 is at least partially isolated from airflow across the circuit card assembly 1000 associated with the GPUs 1010. A second zone 1052 can be establish so that the GPUs 1010 are at least partially isolated from airflow across the circuit card assembly 1000 associated with the connector assembly 1012. In this manner, each of the connector assembly 1012 and the GPUs 1010 receive fresh air independently.

This configuration can be accomplished in a variety of ways. In one configuration, the cover can include walls extending downward. For example, the cover can include a wall following the edge 1054 between the first zone 1050 and the second zone 1052. In another configuration, a circuit card 1002 can have an upward extending wall following edge 1054. In still another configuration, a combination of upward extending wall features from the circuit card 1002 and downward extending wall features from the cover can define a wall following edge 1054.

While various embodiments of the present invention have been described above, it should be understood that they have been presented by way of example only, and not limitation. Numerous changes to the disclosed embodiments can be made in accordance with the disclosure herein without departing from the spirit or scope. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a", "an", and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A circuit card assembly for removable attachment to a computer system having a plurality of bracket slots arranged with a fixed pitch, the circuit card assembly comprising:
    a circuit card having a front end, a back end, and substantially parallel longitudinal edges between the front end and the back end, the circuit card including at least one bus connector extending from one of the longitudinal edges;
    a bracket structure providing a mounting surface at a first end of said circuit card extending perpendicularly to a first surface of said circuit card and extending perpendicularly to said parallel longitudinal edges, the mounting surface comprising a bracket for engaging with a plurality of adjacent ones of the plurality of bracket slots;
    a connector assembly disposed on the surface of said circuit card at said first end, the connector assembly comprising a first input/output (I/O) connector and a second I/O connector in a stacked arrangement with respect to the surface of said circuit card, wherein a width of the connector assembly is less than a width of the circuit card between the longitude edges; and
    a U-shaped cover disposed over the surface of the circuit card, the U-shaped cover having a first open end coincident with the first end of the circuit card, a second open end coincident with the second end of the circuit card, and a wall extending from an inner surface the U-shaped cover towards the surface of the circuit card, the wall defining at least a first zone and a second zone, wherein the first I/O connector is positioned between the second I/O connector and said circuit card, and wherein the first I/O connector and the second I/O connector extend through the bracket and are separated by the fixed pitch.

2. The circuit card assembly of claim 1, wherein the connector assembly comprises a unitary body mechanically coupling the first I/O connector and the second I/O connector.

3. The circuit card assembly of claim 2, wherein the connector assembly further comprises one or more heat sink structures disposed on outer surface of the unitary body.

4. The circuit card assembly of claim 2, wherein the unitary body comprises one or more spaces between the first I/O connector and the second I/O connector, and wherein the connector assembly further comprises one or more additional heat sink structures disposed in at least one of the spaces.

5. The circuit card assembly of claim 4, wherein additional heat sink structures comprise a plurality of fins extending parallel to the parallel longitudinal edges.

6. The circuit card assembly of claim 1, wherein the connector assembly comprises a first connector structure extending from the surface of the first circuit card and containing the first I/O connector, and a second connector structure extending from the surface of the first circuit card independently from the first connector structure and containing the first I/O connector.

7. The circuit card assembly of claim 6, wherein the second connector structure comprises:
    a circuit sub-board having the second I/O connector disposed thereon; and
    a board connector structure coupling the circuit sub-board to the circuit card.

8. The circuit card assembly of claim 1, further comprising a U-shaped cover disposed over the surface of the circuit card, the U-shaped cover having a cut-out for a portion of the surface of the circuit card having the connector assembly disposed thereon.

9. The circuit card assembly of claim 1, further comprising:
    a plurality of heat generating components disposed on the surface of the circuit card;
    wherein the first zone defines a path from the first open end to the second open end including the connector assembly and excluding the plurality of heat generating components, wherein the second zone defines a path from the first open end to the second open end excluding the connector assembly and including the plurality of heat generating components.

10. The circuit card assembly of claim 9, wherein the plurality of heat generating components comprise at least one graphics processing unit.

11. The circuit card assembly of claim 1, wherein the bus connector is a Peripheral Component Interconnect Express (PCIe) connector.

12. The circuit card assembly of claim 1, wherein each of the first I/O connector and the second I/O connector are Quad Small Form-factor Pluggable (QSFP) connectors.

13. The circuit card assembly of claim 1, wherein the plurality of bracket slots are ISA bracket slots.

14. The circuit card assembly of claim 1, wherein the connector assembly further comprises a third I/O connector and a fourth I/O connector in a stacked arrangement with respect to the surface of said circuit card.

* * * * *